(12) United States Patent
Lin

(10) Patent No.: US 7,032,105 B2
(45) Date of Patent: Apr. 18, 2006

(54) METHOD AND APPARATUS FOR USING A DYNAMIC RANDOM ACCESS MEMORY IN SUBSTITUTION OF A HARD DISK DRIVE

(75) Inventor: I-Ming Lin, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 304 days.

(21) Appl. No.: 10/249,439

(22) Filed: Apr. 10, 2003

(65) Prior Publication Data

US 2003/0196033 A1 Oct. 16, 2003

(30) Foreign Application Priority Data

Apr. 11, 2002 (TW) .............................. 91107383 A

(51) Int. Cl.
*G06F 15/177* (2006.01)

(52) U.S. Cl. .............................. 713/1; 711/105; 711/202

(58) Field of Classification Search .................... 713/1, 713/100; 711/105, 202
See application file for complete search history.

(56) References Cited

U.S. PATENT DOCUMENTS

| | | | | |
|---|---|---|---|---|
| 4,935,900 A | * | 6/1990 | Ohsawa | ...................... 365/222 |
| 5,923,829 A | * | 7/1999 | Ishii et al. | ...................... 714/7 |
| 6,016,263 A | * | 1/2000 | Chen | ........................... 365/51 |
| 6,122,745 A | * | 9/2000 | Wong-Insley | ............... 713/300 |
| 6,199,139 B1 | * | 3/2001 | Katayama et al. | .......... 711/106 |
| 6,646,942 B1 | * | 11/2003 | Janzen | ....................... 365/222 |
| 6,735,726 B1 | * | 5/2004 | Muranaka et al. | .......... 714/708 |
| 2003/0126327 A1 | * | 7/2003 | Pesola et al. | ................. 710/74 |
| 2003/0196031 A1 | * | 10/2003 | Chen | ........................... 711/104 |

* cited by examiner

*Primary Examiner*—Chun Cao
(74) *Attorney, Agent, or Firm*—Winston Hsu

(57) ABSTRACT

A method and a related apparatus for using a dynamic random access memory (DRAM) in substitution of a hard disk drive in a computer system. The computer system has a request format transformation module for transforming a hard disk request signal into a corresponding memory request signal, a memory read/write control circuit for accessing the DRAM, and a memory refresh circuit for periodically refreshing the DRAM to maintain data stored in the DRAM. When the computer system issues the hard disk request signal, the hard disk request signal is transformed into the corresponding memory request signal to access the DRAM instead of a hard disk drive. In addition, when the computer system executes an S4 or S5 state according to the specification of advanced configuration and power interface, the memory refresh circuit will repeatedly refresh the DRAM.

13 Claims, 3 Drawing Sheets

METHOD AND APPARATUS FOR USING A DYNAMIC RANDOM ACCESS MEMORY IN SUBSTITUTION OF A HARD DISK DRIVE

BACKGROUND OF INVENTION

1. Field of the Invention

The present invention relates to a computer system using memory in substitution of a hard disk drive, and more particularly, to a computer system using a dynamic random access memory in substitution of a hard disk drive.

2. Description of the Prior Art

Presently, microprocessor-based systems used for handling a great amount of data are applied in a broad spectrum of fields. The most commonly used system is a general computer system in an office or at home. When working, people can deal with digital data quickly and efficiently with the help of the computer system. When at home, people can use the computer system to entertain themselves with a multimedia program such as a computer game. Recently, the processing speeds of computer systems have greatly improved due to the advanced development of central processing units (CPUs). The operating frequency of the CPU has exceeded one gigahertz, that is, the total number of instructions executed within one second has greatly increased, thereby making the computer system more powerful. However, the computer system includes a plurality of components, and each component has its own processing speed. Therefore, components with a low processing speed will delay the overall performance of the computer system.

Please refer to FIG. 1, which is a block diagram of a first prior art computer system (10). The computer system (10) has a central processing unit (CPU) (12), a north bridge circuit (14), a south bridge circuit (16), a memory component (18), a hard disk drive (20), a video graphics array (VGA) card (22), a display device (24), and an input device (26). The CPU (12) is used for controlling each circuit in the computer system (10) to make the computer system (10) function normally. The north bridge circuit (14) is electrically connected to the CPU (12) for managing data transmissions between the CPU (12) and the memory (18) (dynamic random access memory for example), and managing data transmissions between the CPU (12) and the VGA card (22). The display device, such as a monitor, is electrically connected to the VGA card (22) for displaying video data outputted from the VGA card (14). The south bridge circuit (16) is electrically connected to the north bridge circuit (14) for exchanging data with the CPU (12) through the north bridge circuit (14). For example, the south bridge circuit (36) is capable of handling data transmission between the input device (26) and the CPU (12), and handling data transmissions between the CPU (12) and the hard disk drive (20). The input device (26) could be a keyboard or a mouse. As the memory (18) is a volatile storage medium and the hard disk drive (20) is a non-volatile storage medium, data stored in the memory (18) will be lost when there is a lack of electric power, but the data stored on the hard disk drive (20) are not affected by the lack of electric power when the computer system (10) is shut down. Therefore, user data are mainly stored on the hard disk drive (20) to prevent data from being lost due to a sudden shortage of electric power. The operation of the computer system (10) is briefly described as follows. The CPU (12) sends a data access instruction to the hard disk drive (20). The data stored on the hard disk drive (20) are retrieved and are transmitted from the south bridge circuit (16) to the north bridge circuit (14). The north bridge circuit (14) then stores data from the hard disk drive (20) on the memory (18). The CPU (12), therefore, can access data stored in the memory (18) through the north bridge circuit (14), and temporarily stores the retrieved data into a cache (not shown) of the CPU (12) to be further processed. When the computer system (10) prepares to shut down, data stored in the memory (18) will first be restored onto the hard disk drive (20) to prevent data stored in the memory (18) from being lost. However, the data access speed of the memory (18) is faster than that of the hard disk drive (20). For example, the data access speed of the memory (18), such as a dynamic random access memory, is in nanoseconds. However, the data access speed of the hard disk drive (20) is based in milliseconds. That is, the hard disk drive (20) is a peripheral with a slow processing speed. The performance of the computer system (10) is then deteriorated by the speed of the hard disk drive (20). In addition, concerning the amount of data transferred per second, the memory (18) is also better than the hard disk drive (20). Therefore, it is a logical step to increase the performance of the computer system (10) with the help of the memory (18) owing to the short access time and great transmission efficiency of the memory (18).

Please refer to FIG. 2, which is a block diagram of a second prior art computer system (30). The computer system (30) has a CPU (32), a north bridge circuit (34), a south bridge circuit (36), a memory (38), a hard disk drive (40), a VGA card (42), a display device (44), and an input device (46). The function of each element in the computer system (30) has been described above in the section related to the computer system (10) and there is no need to repeat the descriptions. The memory (38) has a system block (48) and a RAM driver block (50) in which the system block (48) is used by an operating system, and the RAM driver block (50) is used for temporarily replacing the hard disk drive (40). The memory address range and related capacity of the RAM driver block (50) are transmitted to the operating system during a power on self test (POST) process. The operating system will then store a terminate and stay resident (TSR) program (52) in the system block (48). The TSR program (52) is used for managing the data access of the RAM driver block (50). When the CPU (32) attempts to access the hard disk drive (40), the TSR program (52) first intercepts an interrupt vector related to access of the hard disk drive (40), converts a hard disk drive access instruction into a memory access instruction, and converts data complying with a hard disk drive storage format into data complying with a memory storage format. The data, which are originally designated to be recorded on the hard disk drive (40), are temporarily stored in the RAM driver block (50). As the data access speed of the memory (38) is faster than that of the hard disk drive (40), the CPU (32) uses the TSR program (52) stored in the memory (38) to manage the data access of the RAM driver block (52) so that the CPU (32) can quickly use data stored in the RAM driver block (52) to speed up the operation of the computer system (30). In addition, the CPU (32) restores data that has been processed into the RAM driver block (50) from the hard disk drive (40) with the help of the TSR program (52). In conclusion, the computer system (30) uses a software method, the TSR program (52), to manage data flow between the memory (38) and the hard disk drive (40) without modifying actual hardware circuits. However, the computer system (30) still requires the presence of a hard disk drive (40) because the memory (38) is a volatile storage medium. If the computer system (30) is turned off, the memory (38) will lose stored data owing to a sudden shortage of electric power. In other words, the computer system (30) has to restore data stored in the memory (38) into a non-volatile storage medium, such as the hard disk drive (40), to maintain the data when the system is shut down. This is the reason why the computer system (30) requires the presence of a hard disk drive (40).

Furthermore, the prior art computer system also adopts non-volatile memory such as flash memory as a storage medium for the computer system, and also uses the same technology of computer system (30) shown in FIG. 2 to store data without a hard disk drive. As the flash memory and the hard disk drive are non-volatile storage media, the data stored in the flash memory are maintained when the computer system is shut down. That is, the computer system with the flash memory does not need to restore data back to the hard disk drive when the computer system is about to shut down. However, the flash memory stores binary data by changing the threshold voltage of each memory cell thereof, and the time spent on writing data is longer than that of general dynamic random access memory. That is, the processing speed of the flash memory is slower than that of the dynamic random access memory. In addition, the cost of manufacturing the flash memory is greater than that of the dynamic random access memory when the same memory capacity is considered. Concerning the cost of such a product, the flash memory is not suitable for a computer system that must access a great amount of data.

SUMMARY OF INVENTION

It is therefore a primary objective of the claimed invention to provide a computer system with a dynamic random access memory to replace a hard disk drive to solve the above-mentioned problem.

Briefly, the claimed invention provides a computer system comprising a processor for controlling the operations of the computer system, a dynamic random access memory for storing programs and data, a bridge circuit electrically connected to the processor and the dynamic random access memory for controlling data transmissions between the processor and the dynamic random access memory, a memory control circuit for accessing data stored in the dynamic random access memory according to the memory access instruction; and a data self-refresh circuit for refreshing the dynamic random access memory constantly to maintain data stored in the dynamic random access memory. The bridge circuit comprises a conversion circuit for changing formats of instructions and data. The conversion circuit comprises an instruction format conversion module for converting a hard disk access instruction into a memory access instruction. When the processor issues the hard disk access instruction, the bridge circuit will access data stored in the dynamic random access memory according to the hard disk access instruction, and when the computer system is in a sleep state or a power-off state, the data self-refresh circuit will constantly refresh the dynamic random access memory to maintain data stored in the dynamic random access memory.

It is an advantage of the claimed invention that the claimed computer system uses a dynamic random access memory in substitution of a hard disk drive, and is equipped with an uninterruptible power supply to provide the required operating voltage to refresh the dynamic random access memory. The claimed computer system not only takes advantage of quick access speeds of the volatile memory when the computer system is turned on, but also takes advantage of a permanent data storage of the non-volatile memory when the computer system is shut down.

These and other objectives of the claimed invention will become obvious to those of ordinary skill in the art after reading the following detailed description of the preferred embodiment, which is illustrated in the various figures and drawings.

DETAILED DESCRIPTION

Figure 3:
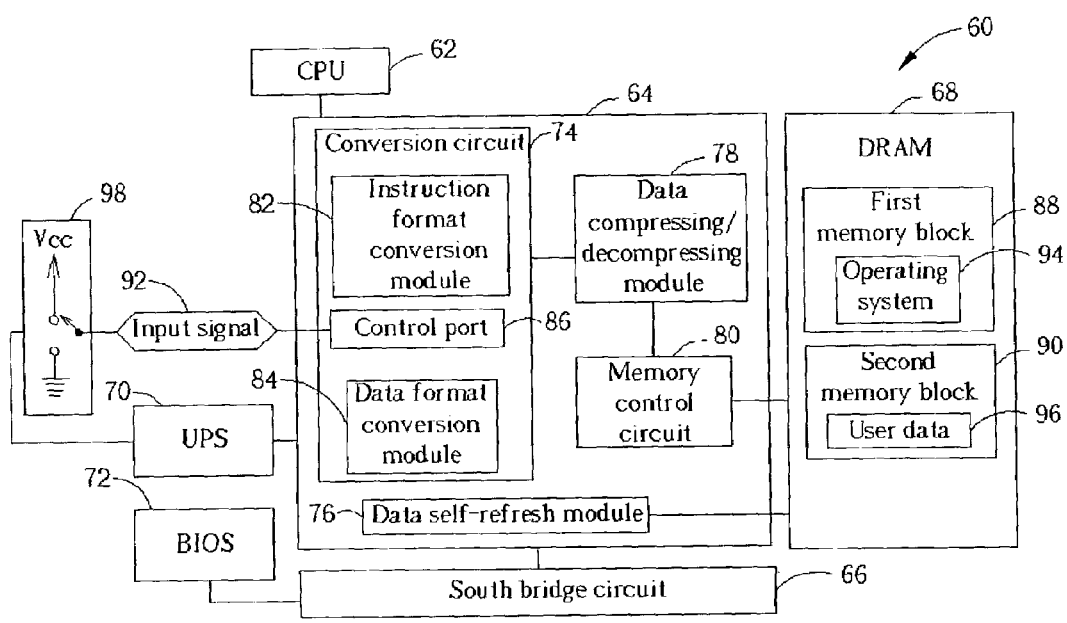
FIG. 3 is a block diagram of a computer system according to the present invention.

Please refer to FIG. 3, which is a block diagram of a computer system (60) according to the present invention. The computer system (60) has a central processing unit (CPU) (62), a north bridge circuit (64), a south bridge circuit (66), a dynamic random access memory (DRAM) (68), an uninterruptible power supply (UPS) (70), and a basic input/output system (BIOS) (72). The north bridge circuit (64) has a conversion circuit (74), a data self-refresh module (76), a data compressing/decompressing module (78), and a memory control circuit (80). The conversion circuit (74) has an instruction format conversion module (82), a data format conversion module (84), and a control port (86). The DRAM (68) has a first memory block (88) and a second memory block (90). The CPU (60) is used for controlling overall operations of the computer system (60). The north bridge circuit (64) is used for controlling data transmission between the CPU (62) and the DRAM (68). The south bridge circuit (66) is used for controlling data transmissions between the BIOS (72) and the CPU (62) and controlling data transmissions of other peripherals (for example a keyboard and a mouse) and the CPU (62). The DRAM (68), such as a double data rate (DDR), memory is used for storing data and programs. The conversion circuit (74) is used for changing the formats of signals. The instruction format conversion module (82) is used for converting a hard disk access instruction into a memory access instruction, and the data format conversion module (84) is used for converting data complying with a hard disk storage format into data complying with a memory storage format. In addition, the control port (86) is used for receiving an input signal (92), and determining whether the conversion circuit (74) is activated or not according to the input signal (92). The memory control circuit (80) is used for controlling data access of the DRAM (68). The data compressing/decompressing module (78) is used for compressing the data that is about to be stored to reduce the corresponding data size in the DRAM (68), and decompressing compressed data retrieved from the DRAM (68) during the recovery of original data. The data self-refresh circuit (76) is used for constantly self-refreshing data stored in the DRAM (68) to prevent data from being lost or corrupted. The uninterruptible power supply (70) is used for providing the north bridge circuit (64) and the data self-refresh circuit (76) with appropriate operating voltages when the computer system (60) encounters a power failure so that the data self-refresh circuit (76) still can self-refresh the DRAM (68) to maintain the integrity of stored data. In the preferred embodiment, the first memory block (88) of the DRAM (68) is used for storing an operating system (94), and the second memory block (90) is used for storing user data (96). The CPU (62)

will retrieve the user data (96) from the second memory block (90) to process the user data (96), and then the user data (96) that have been processed are restored back to the second memory block (90).

The operation of the computer system (60) according to the present invention is described as follows. The user can first use a switch (98) to select whether the conversion circuit (74) is to be activated. That is, the user selects whether the prior art hard disk drive is to be replaced by the DRAM (68). The switch (98) can generate the input signal (98) with different voltage levels. Therefore, the control port (86) of the conversion circuit (74) can determine whether the conversion circuit (74) is going to be activated or not according to the voltage level of the input signal (92). For example, the user can use the switch (98) to generate the input signal (92) with a voltage level (Vcc) to the control port (86) so that the conversion circuit (74) is enabled. On the contrary, the user can use the switch (98) to generate the input signal (92) with a grounding voltage (0V) to the control port (86) so that the conversion circuit (74) is disabled. Please note that the switch (98) is electrically connected to the uninterruptible power supply (70), and different voltage levels of the input signal (92) are provided by the uninterruptible power supply (70). In addition, the switch (98) is hardware such as a jumper to select different voltage levels Vcc and 0 so that the status of the switch (98) is not affected by any power failures that the computer system (60) may encounter. When the computer system (60) is turned on, the BIOS (72) first detects the input signal (92). If the input signal (92) enables the conversion circuit (74), the BIOS (72) will divide the DRAM (68) into at least a first memory block (88) and a second memory block (90) respectively used for individually storing the operating system (94) and the user data (96). The second memory block (90) is used for replacing the prior art hard disk drive. The BIOS (72) simultaneously informs the operating system (94) about the memory address and capacity of the second memory block (90). The operating system (94) identifies the second memory block (90) as a virtual hard disk drive in the computer system (60). Therefore, an interrupt vector such as INT 13, which is used for accessing a hard disk drive, is intercepted by the conversion circuit (74), and then a hard disk access instruction generated by the CPU (62) is converted into a memory access instruction to access user data (96) stored in the second memory block (90). In addition, the data complying with a hard disk storage format will be converted into data complying with a memory storage format. For example, the data format conversion module (84), according to the present invention, will transform information about heads, cylinders, and sectors into information about memory addresses so that the data are stored in the second memory block (90) successfully. In addition, in order to increase the storage capacity of the fixed second memory block (90), the data compressing/decompressing module (78) first compresses data that is to be stored in the second memory block (90), and then the memory control circuit (80) writes the compressed data into the second memory block (90). When the CPU attempts to read user data (96) stored in the second memory block (90), the memory control circuit (80) will first retrieve compressed data from the second memory block (90), and then the data compressing/decompressing module (78) decompresses the compressed data to recover the original data. Finally, the data are further transmitted to the CPU (62) for subsequent operations through the north bridge circuit (64).

According to an advanced configuration and power interface (ACPI) specification, a computer system has to store current configuration data of the computer system in a hard disk when the computer system is in an S4 state so that the computer system can quickly boot again after the computer system is shut down. Furthermore, when the computer system is in an S5 state, the computer system is going to shut down and breaks off the electric power. The computer system, therefore, has to transfer all data temporarily stored in the memory back to the hard disk drive in order to maintain the data. In the preferred embodiment, the computer system (60) uses the DRAM (68) to replace the prior art hard disk drive. As the DRAM (68) is a volatile storage medium, the data stored in the DRAM (68) are lost when the electric power required by the DRAM (68) is cut off. Therefore, the present invention discloses a device and a method thereof to constantly self-refresh the memory. When the computer system (60) is in either the S4 state or the S5 state, the uninterruptible power supply (70) will constantly provide the north bridge circuit (64) and the data self-refresh circuit (76) with appropriate operating voltages so that the north bridge circuit (64) still can control the data self-refresh circuit (76) to self-refresh the DRAM (68) when the computer system (60) is turned off. That is, the DRAM (68) is constantly refreshed to maintain data and programs stored in the DRAM (68) with the help of the uninterruptible power supply (70). In the preferred embodiment, the memory functions of the DRAM (68) are very similar to a non-volatile storage medium. In conclusion, the DRAM (68), according to the present invention, not only has a faster data access speed than the prior art hard disk drive, but also maintains stored data when the computer system is completely turned off.

As the electric power consumed during the self-refresh operation of the DRAM (68) is provided by the uninterruptible power supply (70), the preferred embodiment also can establish another uninterruptible power supply as a backup power supply so as to improve storage stability of the computer system (60). In other words, a plurality of uninterruptible power supplies (70) are capable of providing the data self-refresh circuit (76_ with an operating voltage to execute a self-refresh operation on the DRAM (68) when the computer system (60) enters an S4 state or an S5 state. Therefore, data are still kept in the DRAM (68) even though the computer system (60) is completely powered off.

Presently, a general computer system uses memory modules, which have many memory chips packaged on one circuit board, to extend the required memory capacity. For example, a desktop computer uses dual in-line memory modules (DIMM), and the laptop computer uses small outline dual in-line memory modules (SODIMM). The memory modules are inserted into corresponding memory slots of the computer system. In the preferred embodiment, the BIOS (72) is used for directly dividing the DRAM (68) into the first memory block (88) and the second memory block (90). Furthermore, the first memory block (88) and the second memory block (90) can be generated by an allocation of memory modules. Each memory slot (not shown) of the computer system (60) corresponds to a unique jumper so that the user can determine a mapping relation between the memory modules and the memory blocks (88, 90) through the setting of jumpers. In addition, the BIOS (72) can read each jumper setting to ascertain whether information about the current allocation of the DRAM (68), and information about the memory address and related capacity of each memory block (88, 90) has been transmitted to the operating system. Both a software setting (BIOS 72) and a hardware setting (jumper) can achieve an objective of dividing the DRAM (68) into a first memory block (88) and a second memory block (90).

Figure 1:
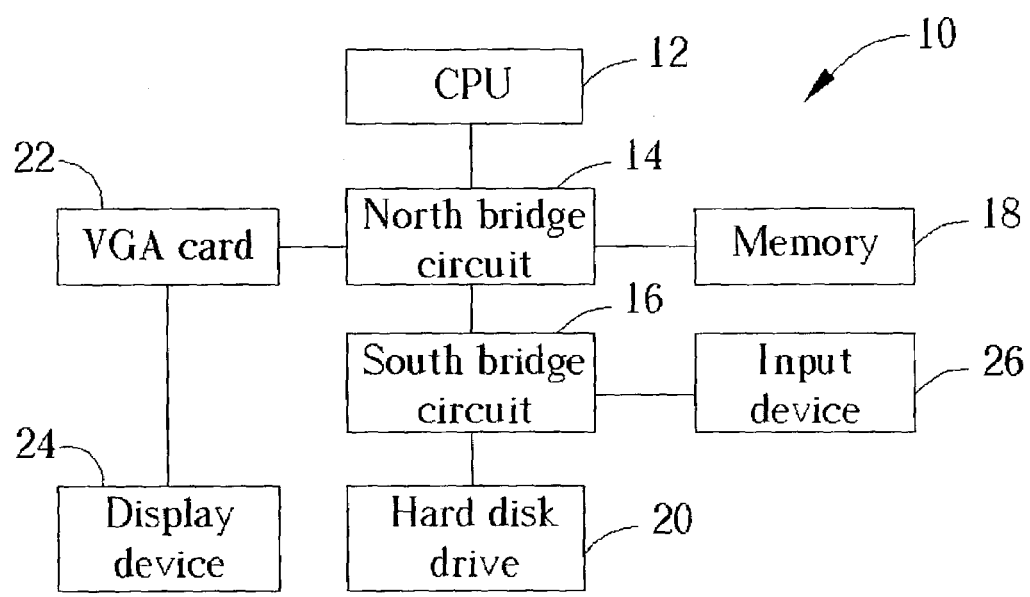
FIG. 1 is a block diagram of a first prior art computer system.
Figure 2:
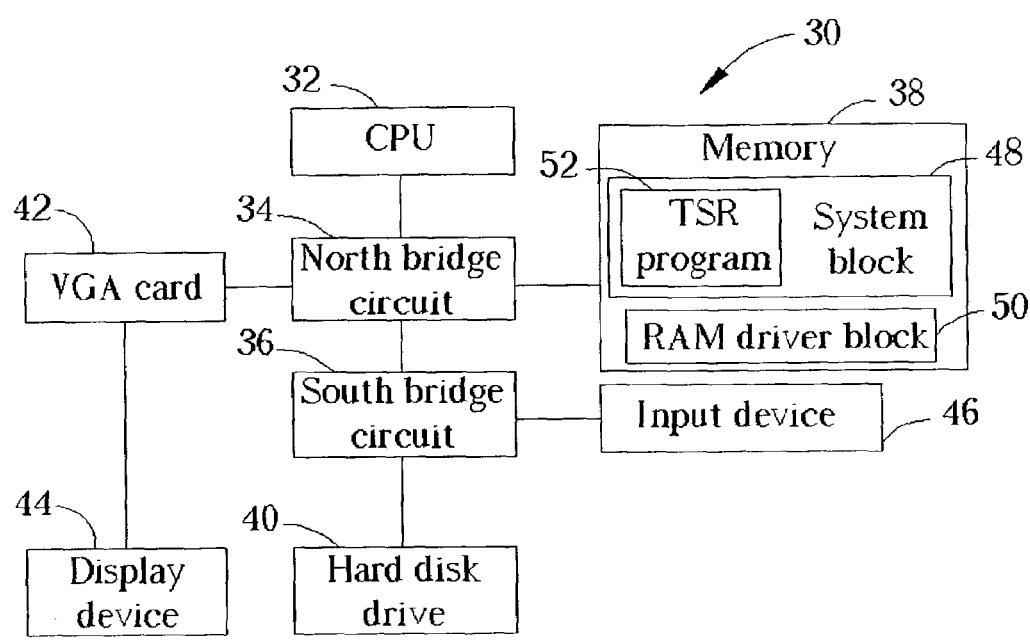
FIG. 2 is a block diagram of a second prior art computer system.

In addition, if the user disables the conversion circuit (74) through the switch (98), the DRAM (68) is not used to replace the prior art hard disk drive. The computer system (60) can also be equipped with a hard disk drive, as shown in FIG. 1, and perform data storage operations as usual. The DRAM (68), like the memory (18) of the computer system (10), is used for temporarily storing data. In other words, the computer system (60), according to the present invention, only adds an additional signal conversion function to the north bridge circuit (64) without affecting the operation of other components within the computer system (60), and the well-known computer structure, therefore, remains unchanged. The user can adopt the claimed function of using the DRAM (68) as a substitute for the hard disk drive or still use the prior art hard disk drive to store data according to demands of the user.

In contrast to the prior art computer system, the claimed computer system uses a dynamic random access memory in substitution of a hard disk drive, and is equipped with an uninterruptible power supply to provide the required operating voltage to refresh the dynamic random access memory. The claimed computer system not only takes advantage of a quick access speed of the volatile memory when the computer system is turned on, while still providing the advantages of permanent data storage of non-volatile memory when the computer system is shut down. In addition, the claimed computer system only adds an additional signal conversion function to the north bridge circuit without altering the functions of other components or connections between other components in the same computer structure. Therefore, the claimed computer system is easily implementated. Furthermore, the claimed computer system only uses hardware to perform format conversions of instructions and data, making the related hardware suitable for any kind of platform. That is, the claimed computer system does not encounter the problem of porting the prior art software between different platforms. As the dynamic random access memory has a fast data access speed, system delays caused by the data access of the hard disk drive are greatly reduced. Compared with the hard disk drive, the dynamic random access memory has many advantages such as a lighter weight, low power consumption, silent operation, a good resistance to outer shock, and a low heat radiation. In conclusion, the claimed computer system could be applied to information appliances (IA) and information personal computers to provide a device that has a fast processing speed, generates less noise, and saves power.

Those skilled in the art will readily observe that numerous modifications and alterations of the device may be made while retaining the spirit of the invention. Accordingly, the above disclosure should be construed as limited only by what is set forth in the appended claims.

What is claimed is:

1. A computer system comprising:
    a processor for controlling operations of the computer system;
    a dynamic random access memory (DRAM) for storing programs and data;
    a basic input/output system for dividing the dynamic random access memory (DRAM) into a first memory block and a second memory block during a power on self test (POST) process, wherein the first memory block is used for storing an operating system (OS), and the second memory block is used for storing user data; and
    a bridge circuit electrically connected to the processor and the dynamic random access memory (DRAM) for controlling data transmissions between the processor and the dynamic random access memory (DRAM), the bridge circuit comprising:
        a conversion circuit for changing formats of instructions and data, the conversion circuit comprising:
            an instruction format conversion module for converting a hard disk access instruction into a memory access instruction;
            a data format conversion module for converting data complying with a hard disk storage format into data complying with a memory storage format so that the data complying with the hard disk storage format are stored in the second memory block; and
            a control port for receiving an input signal to determine whether the conversion circuit is activated;
        a memory control circuit for accessing data stored in the dynamic random access memory (DRAM) according to the memory access instruction; and
        a data self-refresh circuit for constantly refreshing the dynamic random access memory (DRAM) to maintain data stored in the dynamic random access memory (DRAM);
    wherein when the processor issues a hard disk access instruction, the bridge circuit will access data stored in the dynamic random access memory (DRAM) according to the hard disk access instruction, and when the computer system is in a sleeping state or a power-off state, the data self-refresh circuit will constantly refresh the dynamic random access memory (DRAM) to maintain the data stored in the dynamic random access memory (DRAM),
    wherein the basic input/output system will read the input signal during the power on self test (POST) process, and will determine whether the first and second memory blocks are generated.

2. The computer system of claim 1 further comprising an uninterruptible power supply electrically connected to the bridge circuit for continuously providing the data self-refresh circuit with an operating voltage.

3. The computer system of claim 1 wherein the conversion circuit further comprises a compression/decompression module electrically connected to the second memory block for compressing data inputted to the second memory block and decompressing data retrieved from the second memory block.

4. The computer system of claim 1 wherein the dynamic random access memory (DRAM) further comprises at least two memory modules individually installed into two memory slots of the computer system, one memory module corresponds to the first memory block, and another memory module corresponds to the second memory block.

5. The computer system of claim 1 wherein the sleeping state and the power-off state individually conform to an S4 state and an S5 state defined by an advanced configuration and power interface (ACPI) specification.

6. The computer system of claim 1 wherein the bridge circuit is a north bridge circuit.

7. A control method for controlling the data access of a computer system, the computer system comprising a processor for controlling operations of the computer system and a dynamic random access memory (DRAM) for storing programs and data; the control method comprising:

receiving an input signal during the power on self test (POST) process to determine whether to divide the dynamic random access memory (DRAM) into a first memory block and a second memory block during a power on self test (POST) process, wherein the first memory block is used for storing an operating system (OS), and the second memory block is used for storing user data, wherein if the input signal is greater than a predetermined voltage, the dynamic random access memory (DRAM) is divided into the first memory block and the second memory block;

converting data complying with a hard disk storage format into data complying with a memory storage format so that the data are stored in the second memory block;

converting a hard disk access instruction issued by the processor into a memory access instruction;

accessing the dynamic random access memory (DRAM) according to the memory access instruction; and refreshing the dynamic random access memory (DRAM) constantly during sleeping states and power-off states to maintain data stored in the dynamic random access memory (DRAM).

8. The control method of claim 7 further comprising the determination of whether the data complying with the hard disk storage format are converted into data complying with the memory storage format, and the hard disk access instruction is converted into the memory access instruction according to the input signal.

9. The control method of claim 7 wherein the dynamic random access memory (DRAM) comprises at least two memory modules individually installed in two memory slots of the computer system, one memory module corresponds to the first memory block, and another memory module corresponds to the second memory block.

10. The control method of claim 7 further comprising the compression of data inputted to the second memory block and the decompression of data retrieved from the second memory block.

11. The control method of claim 7 wherein the sleeping state and the power-off state individually conform to an S4 state and an S5 state defined by an advanced configuration and power interface (ACPI) specification.

12. A computer system comprising:
a processor for controlling operations of the computer system;
a dynamic random access memory (DRAM) for storing programs and data;
a basic input/output system for dividing the dynamic random access memory (DRAM) into a first memory block and a second memory block during a power on self test (POST) process; and
a bridge circuit electrically connected to the processor and the dynamic random access memory (DRAM) for controlling data transmissions between the processor and the dynamic random access memory (DRAM), the bridge circuit comprising:

a conversion circuit for changing formats of instructions and data, the conversion circuit comprising an instruction format conversion module for converting a hard disk access instruction into a memory access instruction, wherein the conversion circuit further comprises a control port for receiving an input signal to determine whether the conversion circuit is activated;

a memory control circuit for accessing data stored in the dynamic random access memory (DRAM) according to the memory access instruction; and a data self-refresh circuit for constantly refreshing the dynamic random access memory (DRAM) to maintain data stored in the dynamic random access memory (DRAM);

wherein when the processor issues a hard disk access instruction, the bridge circuit will access data stored in the dynamic random access memory (DRAM) according to the hard disk access instruction, and when the computer system is in a sleeping state or a power-off state, the data self-refresh circuit will constantly refresh the dynamic random access memory (DRAM) to maintain the data stored in the dynamic random access memory (DRAM), wherein the basic input/output system will read the input signal during the power on self test (POST) process, and will determine whether the first and second memory blocks are generated.

13. A control method for controlling the data access of a computer system, the computer system comprising a processor for controlling operations of the computer system and a dynamic random access memory (DRAM) for storing programs and data; the control method comprising:

receiving an input signal during the power on self test (POST) process to determine whether to divide the dynamic random access memory (DRAM) into a first memory block and a second memory block during the power on self test (POST), wherein if the input signal is greater than a predetermined voltage, the dynamic random access memory (DRAM) is divided into the first memory block and the second memory block;

converting a hard disk access instruction issued by the processor into a memory access instruction;

accessing the dynamic random access memory (DRAM) according to the memory access instruction; and refreshing the dynamic random access memory (DRAM) constantly during sleeping states and power-off states to maintain data stored in the dynamic random access memory (DRAM).

* * * * *